United States Patent [19]
Blalock

[11] Patent Number: 5,320,981
[45] Date of Patent: Jun. 14, 1994

[54] HIGH ACCURACY VIA FORMATION FOR SEMICONDUCTOR DEVICES

[75] Inventor: Guy T. Blalock, Boise, Id.

[73] Assignee: Micron Semiconductor, Inc., Boise, Id.

[21] Appl. No.: 104,230

[22] Filed: Aug. 10, 1993

[51] Int. Cl.$^5$ .......................................... H01L 21/44
[52] U.S. Cl. ................... 437/195; 437/228; 437/947; 437/981; 156/643; 156/644; 156/653
[58] Field of Search ............... 437/187, 195, 981, 947, 437/228; 156/643, 653, 644

[56] References Cited

U.S. PATENT DOCUMENTS

| | | | |
|---|---|---|---|
| 4,687,543 | 8/1987 | Bowker | 156/643 |
| 4,698,128 | 10/1987 | Berglund et al. | 156/643 |
| 4,784,719 | 11/1988 | Schutz | 156/643 |
| 4,855,017 | 8/1989 | Douglas | 156/643 |
| 4,952,274 | 8/1990 | Abraham | 156/643 |
| 5,032,219 | 7/1991 | Buchmann et al. | 156/643 |
| 5,103,493 | 4/1992 | Buchmann et al. | 385/14 |
| 5,141,897 | 8/1992 | Nanocha et al. | 437/228 |
| 5,162,261 | 11/1992 | Fuller et al. | 437/195 |
| 5,223,084 | 6/1993 | Uesato et al. | 156/644 |

OTHER PUBLICATIONS

Bergendahl et al., "A Flexible Approach for Generation of Arbitrary Etch Profiles in Multilayer Films", Solid State Technology, Nov. 1984, pp. 107-112.

Coburn, "Pattern Transfer", Solid State Technology, Apr. 1986, pp. 117-122.

Saia et al., "Dry Etching of Tapered Contact Holes Using Multilayer Resist", Solid State Science and Technology, Aug. 1985, vol. 132, No. 8, pp. 1954-1957.

Weiss, "Plasma Etching of Oxides and Nitrides", Semiconductor Internation, Feb. 1983, pp. 56-62.

Vossen, et al., Thin Film Processes, Academic Press, 1978, pp. 30-47.

*Primary Examiner*—T. N. Quach
*Attorney, Agent, or Firm*—Kevin D. Martin

[57] ABSTRACT

A semiconductor manufacturing process for forming a sloped contact in a layer of dielectric such as oxide comprises the use of an argon etchant. After a planar oxide layer is formed over a conductor, a photoresist mask defines the etch area. The exposed oxide is etched, thereby forming a sloped sidewall and a contact to the underlying conductor. This etch also forms a corner where the sloped sidewall joins the planar surface. The slope formed in the dielectric layer at this point is non-critical. After the photoresist is removed, a second etch using an inert material such as argon, krypton, or xenon is performed. This etch removes material at the corner at a rate of up to four times the removal rate at the sidewall and the planar surface. A faceted edge is thereby formed in the dielectric layer. The material that is removed to form the facet is redeposited over a portion of the sidewall and the conductive layer, and thereby improves the slope of the contact.

21 Claims, 2 Drawing Sheets

HIGH ACCURACY VIA FORMATION FOR SEMICONDUCTOR DEVICES

FIELD OF THE INVENTION

This invention relates, in general, to contact etch processes and, more particularly, to sloped contact etch processes.

BACKGROUND OF THE INVENTION

During the formation of semiconductor devices such as dynamic random access memory (DRAMs), static random access memory (SRAMs), microprocessors, etc. insulating layers such as silicon dioxide, phosphorous-doped silicon dioxide, silicon nitride, etc. are used to electrically separate conduction layers such as doped polycrystalline silicon, aluminum, refractory metal silicides, etc. It is often required that the conduction layers be interconnected through holes in the insulating layer. These holes are referred to as contacts or vias and often must exhibit specific characteristics such as a sloped or tapered profile. The sloped profile is necessary so that the step coverage of the conduction layer into the hole is of adequate thickness. Standard techniques for deposition of the conduction layers include sputtering and evaporation. Both of these techniques provide step coverage of the contact hole that is sensitive to the contact profile. Vertical contact profiles often result in unacceptable step coverage. Highly sloped contact profiles result in good step coverage, however, the contact is often excessively enlarged in this process. This enlargement may cause unwanted electrical shorting between or within conduction layers, and may also reduce the density of the circuit features, that is, limit how close together the devices can be placed.

Providing adequate contact slope is critical to achieving acceptable contact step coverage. Several methods of producing sloped contacts are known. These can be grouped into the general categories of wet etch, wet/dry etch, reactive ion etch (RIE), isotropic/RIE etch, and resist erosion technique.

The wet etch technique uses standard photoresist exposure and development techniques to print the required contact pattern on the insulating layer. To further enhance the slope of this process, $CF_4/O_2$ plasma pretreats have been used to promote preohmic taper. The plasma pretreat is difficult to control and provides non-uniform tapers. The profile of the sides of the photoresist opening are vertical for this type of etch. As the insulating layer is etched, with $NH_4F:HF$ acids of the like, the photoresist will protect the areas not exposed. The chemical wet etch will etch the insulating layer isotropically so that the contact profile is sloped. This process significantly enlarges the contact area due to the nondirectionality of the wet etch. In addition, the acids used suffer from high particulate counts which contaminate the contact area.

The wet/RIE technique process has the disadvantage of requiring two separate etch processes and still uses the acid as in the wet etch. To create an initial slope profile followed by a less sloped profile in the oxide contact (funnel shaped preohmic), two photoresist steps are used each requiring a different acid and/or dry etch to accomplish each objective. Problems resulting from this process include: resist adhesion and phosphorous concentration differences on the oxide surface that cause erratic size and taper of preohmics; excessive undercutting of the preohmics caused by variations in the acid strength from batch to batch, changes in buffering concentrations inherent in the acid solutions (crystals), enhanced etch rate at stress locations, and temperature variations, and; alignment tolerances required result in significant photoresist redo rates.

The isotropic/RIE etch technique first etches the contact pattern delineated by the photoresist into the underlying glass substrate using a high pressure isotropic plasma etch ($CF_4$, 8.5%). The etch is completed with a selective RIE etch step to remove the remaining oxide. The isotropic step of this method is described in U.S. Pat. No. 4,361,599 issued to Robert L. Wourms. This technique results in a cusp shaped taper rather than a sloped taper, may have decreased process stability, and may require additional handling.

In the resist erosion technique, the required contact pattern is printed on the insulating layer, again using standard photoresist exposure and development techniques. Next, the photoresist layer in baked such that the resist flows giving the walls defining the openings in the resist a tapered or sloped profile. Next, the device is dry etched in an environment that will etch the substrate and the resist at the same time. This will replicate the sloped resist profile into the substrate. The disadvantages in this process are that a relatively thick resist layer is required, the scaling of the process does not lend itself to very large scale integration geometries, and the reproducibility across one or more wafers of the particular slope of the baked resist is very poor.

Another type of the resist erosion technique uses resist faceting. First, standard photoresist exposure and development techniques are again used to print the required contact pattern on the insulating layer. A dry etch of the oxide is then conducted using an in situ resist tapering process. By using a low pressure and high oxygen flow etch, the corners or edges of the resist will etch faster than the planar resist. This results in a sloped resist profile referred to as resist faceting. This slope is then replicated into the substrate using the same technique described for the resist erosion technique.

Another form of resist erosion technique is a two step method and uses a two-layer photoresist mask. This is described in Saia, et al., "Dry Etching of Tapered Contact Holes Using a Multilayer Resist", *J. Electrochemistry Soc.: Solid-State Science and Technology* v. 132 (August, 1985). Here the authors describe the process using a two-layer photoresist mask, where the bottom layer is poly (methyl methacrylate) (PMMA) and a plasma gas etch containing $CHF_3$, argon and oxygen. The photoresist to oxide etch rate ratios ranged from 1.5:1 to 1:1.

One of the drawbacks of resist faceting techniques is the limit of the taper produced in the substrate. In order to achieve an appreciable sloped resist profile, a large amount of the resist must be consumed during the faceting step. This resist consumption requires both thickening of the resist and limiting of the of the facet etch time, which is approximately one-half of the total etch time, to prevent resist break through and etching to areas once protected.

The faceting process increases the contact size delineated by the resist prior to the final etch step that removes remaining dielectric. The disadvantages of this technique include the enlargement of the base of the contact beyond the original size delineated in the resist. The final facet etch step, that is required to clear the oxide, will tend to destroy the slope character of the contact.

In general, as devices and line widths have become smaller, wet etching has proved unsuitable for fine line etching below about 3 μm. In addition, profile control has also driven the industry in the direction of plasma (dry) etching. Overviews of etching are reported in Weiss, "Plasma Etching of Oxides and Nitrides", Semiconductor International, p. 56 (February, 1983) and in Coburn, "Pattern Transfer", *Solid State Technology*, p. 117 (April, 1986).

An article by Bergendahl et al., "A Flexible Approach for Generation of Arbitrary Etch Profiles in Multilayer Films", Solid State Technology, 107 (November, 1984), describes an additional method known as multistep contour (MSC) etching. MSC is describes as combining independently optimized process modules to form a complete process. The process described in the Bergendahl article has the problems of filament development and excessive bulk resist removal, and stresses induced by power pulses during all process steps.

While the ideal contact through a dielectric layer between two conduction layers would be a completely metal filled truly vertical contact hole or via, technology to reliably provide such contacts is not yet in place. Therefore, there is still a great need for the ability to control the slope of the contact walls so as to permit good step coverage and contact to the lower conductive layer by the overlying conductive layer.

SUMMARY OF THE INVENTION

The invention comprises the use of two etch steps. The first etch step, which can be either isotropic or anisotropic, opens a dielectric layer to expose an underlying conductive layer. The second etch comprises the use of a material which is substantially inert with the conductive layer and the dielectric layer. As a result, the second etch has a high physical component and a very low chemical component. The etch erodes the dielectric edges of the dielectric at a rate of up to four times that of the planar surface. This provides the desired sloping of the via.

The inventive process begins by the formation of a substantially planar dielectric layer over a conductive layer. An etch resist layer is then formed over said dielectric layer thereby covering a portion of said dielectric layer and leaving a portion of the dielectric layer exposed. The exposed portion of the dielectric layer is etched to form a sidewall in the dielectric layer and to expose the underlying conductive layer. This etching produces an angle at the junction where the planar portion of the dielectric layer intersects the sidewall.

The etch resist layer is removed, and the second etch is performed. The second etch comprises the use of an inert material which erodes the dielectric rather than chemically etching the dielectric.

Other advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
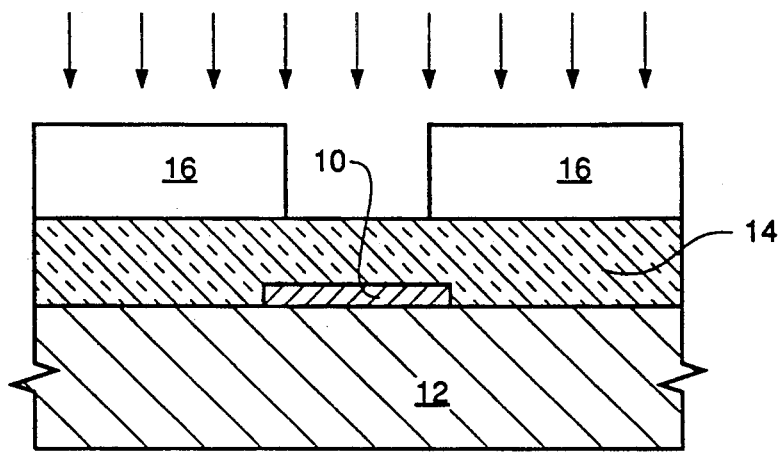
FIG. 1 is a cross section of a first step in the inventive process which etches a dielectric layer over a conductive layer, which is over a substrate.

In accordance with one embodiment of the invention and as shown in FIG. 1, a layer of conductive material 10 such as aluminum or polycrystalline silicon is formed over a semiconductor substrate 12, for example of silicon or gallium arsenide. A layer of dielectric material 14 such as oxide is formed over the conductive layer 10 and a layer of etch resistant material 16 such as photoresist is formed to cover the dielectric layer 14. The dielectric layer 14 is exposed at a point over the conductive layer 10.

Next, an etch of the exposed dielectric layer is performed. The etch can be an isotropic etch, for example using hydrofluoric or some other acid as known in the art. More preferably, however, the exposed dielectric is removed with an anisotropic etch, for example with an RIE or a dry plasma etch. In either case, the etch removes the exposed dielectric layer to expose the underlying conductive layer.

Figure 2:
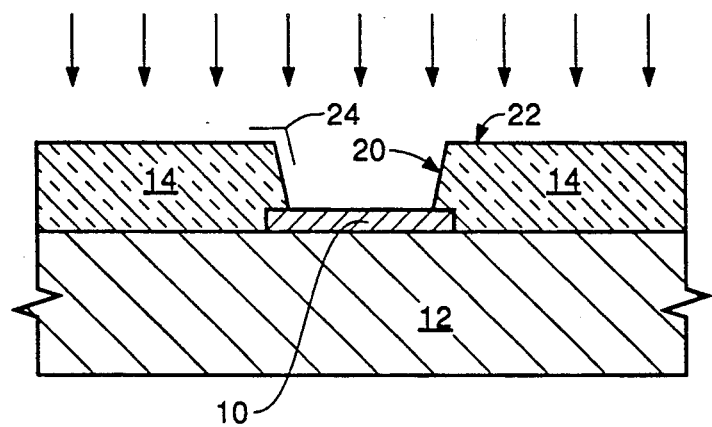
FIG. 2 is a cross section of a second step in the inventive process which etches the dielectric layer a second time.

Whether the exposed dielectric material is removed with a wet or (preferably) a dry etch, a sidewall 20 is formed in the dielectric material 14 as shown in FIG. 2. A substantially planar dielectric surface 22, which is covered by the etch resistant layer 16, remains substantially planar. The angle 24 at the junction of the sidewall 20 and the planar surface 22 of the dielectric 14 is, at this point, a noncritical angle. This is in contrast to other processes that require control of the angle in order to provide adequate contact between a subsequently deposited second conductive layer and the first conductive layer.

Figure 3:
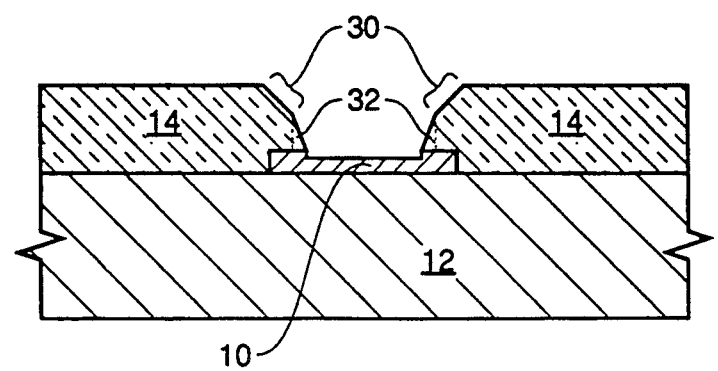
FIG. 3 is a cross section showing the facet and the redeposited dielectric which result from the inventive process.

After the conductive layer 10 is exposed the etch resistant layer 16 is removed and a second etch is performed on the dielectric layer 14 as shown in FIG. 2 which results in the structure of FIG. 3. This etch comprised the use of an argon plasma, but any heavy inert etch material such as argon, krypton, or xenon (nonreactive with, for example, aluminum and $SiO_2$) would function sufficiently. The use of the nonreactive argon resulted in an etch that was as close to a purely physical erosion as possible, as opposed to having a substantial chemical etch component. Note that the underlying conductive layer 10 is also somewhat etched, but the etch material is selected to minimize this removal, and the removal rate is slow as a result of the horizontal surface. This removal can be a process advantage as sputter cleaning of the first metallization surface prior to metal 2 deposition reduces via resistance.

The dielectric material at angle 24 of FIG. 2 etched at about four times the rate of either the sidewall 20 the planar surface 22. This created a facet 30 in the sidewall. This facet 30 had an angle of between about 45° and 50°. The etch that produced the facet created about 600Å to 800Å loss of material along the planar surface of the dielectric, and about 2400Å to 3200Å loss of material along the edge defined by the junction of the sidewall and the planar surface.

In addition to the facet 30 created in the sidewall, a redeposition layer 32 was formed on the sidewall and on a portion of the conductive layer 10. This redeposition layer 32 resulted from the argon etch redepositing the eroded dielectric material back onto the sidewall. This sputter redeposition of the dielectric material further added to the slope of the contact and overcomes the problems associated with previous sloped contacts comprising the use of faceting.

Figure 4:
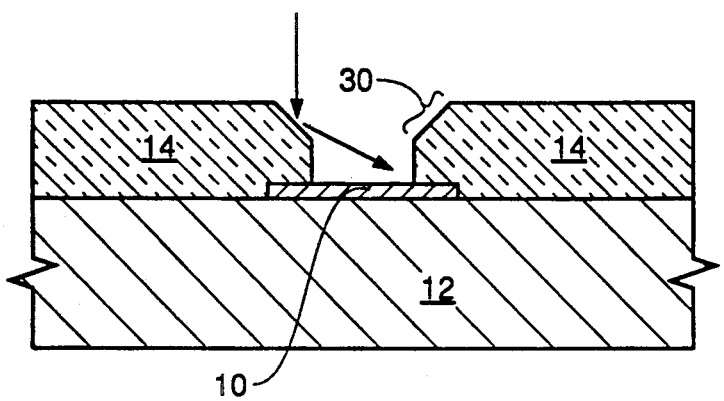
FIG. 4 is a cross section showing the removal of the dielectric at the intersection of the sidewall and the planar dielectric surface.

The facet etch uses a plasma or other source to generate high energy ions which are directed at the dielectric surface in a direction normal or 90° with respect to the global surface. Due to the sputter yield nature of nonreactive bombardment, surfaces which lie on a 45° angle with respect to the impinging ions, such as a portion of angle 24 in FIG. 2, are eroded at a much faster rate. This rate can be up to four times of that of the horizontal surface depending on the sputter yield of the substrate material. This sputter behavior creates the defined faceted or sloped edge at an angle of approximately 45° in the dielectric as shown in FIG. 4 and redeposits at least a portion of the removed dielectric onto the opposite sidewall.

Figure 5:
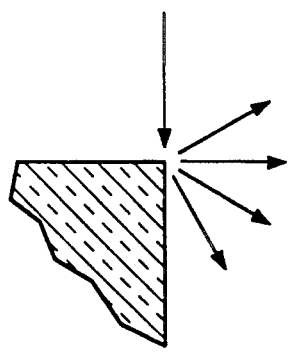
FIG. 5 is a cross section showing the etched dielectric material that disperses according to a cosine distribution.
Figure 6:
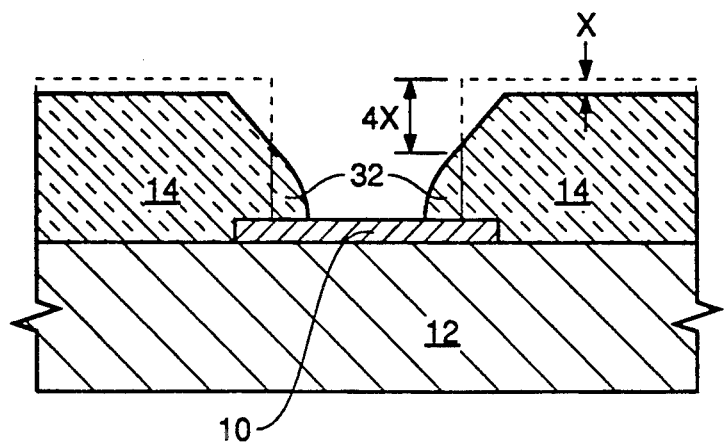
FIG. 6 shows the amount of material removed from the planar surface contrasted with the amount of material removed from the sloped edge of the dielectric material.

In addition to the removal effect, the dielectric material which is sputter etched is redeposited on the wafer according to a cosine distribution as shown in FIG. 5. This acts to form a "spacer" at the bottom of the previously reactive etched profile and thus further enhances the cumulative profile for subsequent conductor deposition steps as shown in FIG. 6. The resulting etch therefore comprises two parts; the removal of the dielectric material where the sidewall and the planar surface intersect, and the redepositing of at least part of the dielectric material onto the opposite sidewall and bottom conductor. FIG. 6 also shows the ratio of the amount of material (x) removed from the horizontal surface of the dielectric to the amount of material (4x) removed from a surface having a 45°–50° slope.

The argon etch used with this inventive embodiment comprised the use of an Applied Materials 5000 Series etcher, with an RF power setting of between about 300–700 watts, a pressure of between about 10–30 millitorr, and an etchant delivery set at between about 30–70 standard $cm^3$. Other inert gases such as xenon are effective etchant gases for performing the facet etch, but argon is preferred because of its weight and commercial availability. The inert gas tends to further enhance the uniformity of the etch process.

After the second etch of the dielectric material, a second conductive layer, in the instant case aluminum, was formed to contact the first conductive layer which was also aluminum.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A process for forming a sloped contact during the formation of a semiconductor device comprising the following steps:
    a) forming a planar dielectric layer over a conductive layer;
    b) forming an etch resist layer over said dielectric layer thereby covering a portion of said dielectric layer and leaving a portion of said dielectric layer exposed;
    c) etching said exposed portion of said dielectric layer thereby forming a sidewall in said dielectric layer and an angle at a junction of said covered dielectric layer and said sidewall, said etching of said exposed portion of said dielectric layer exposing a portion of said conductive layer;
    d) removing said etch resist layer;
    e) facet etching a portion of said dielectric layer at said junction with an inert material to form a faceted edge, said faceted edge formed by the erosion of said dielectric by said inert material;
    f) redepositing said eroded dielectric onto said sidewall and onto a portion of said exposed conductive layer simultaneously with said step e) thereby covering said portion of said exposed conductive layer with said eroded dielectric and narrowing the contact thereby.

2. The process of claim 1 wherein said inert material is argon.

3. The process of claim 1 wherein said inert material is selected from the group consisting of krypton and xenon.

4. The process of claim 1 wherein said faceted edge forms an angle of between about 45° and 50° with said planar dielectric layer.

5. The process of claim 1 wherein said facet etch erodes between about 600Å and 800Å of said dielectric layer in a horizontal direction, and about 2400Å to about 3200Å of said dielectric layer in vertical direction.

6. The process of claim 1 wherein said inert material is argon, said faceted edge forms an angle of between about 45° and 50° with said planar dielectric layer, and wherein said facet etch erodes between about 600Å and 800Å of said dielectric layer in a horizontal direction, and about 2400Å to about 3200Å of said dielectric layer in a vertical direction.

7. The process of claim 6 wherein said etching step comprises an etcher having an RF power setting of between about 300–700 watts, a pressure of between about 10–30 millitorr, and an etchant delivery set at between about 30–70 standard cubic centimeters.

8. The method of claim 1 wherein step c) is an isotropic etch which forms a sloped sidewall in said dielectric layer.

9. A process for forming a sloped contact during the formation of a semiconductor memory device comprising the following steps:
    a) forming a planar oxide layer over a conductive layer;

b) forming an etch resist layer over said oxide layer thereby covering a portion of said oxide layer and leaving a portion of said oxide layer exposed;

c) etching said exposed portion of said oxide layer thereby forming a sidewall in said oxide layer and an angle at a junction of said covered oxide layer and said sidewall, said oxide removal exposing a portion of said conductive layer;

d) removing said etch resist layer;

e) facet etching a portion of said oxide layer at said junction with an inert material to form a faceted edge, said faceted edge formed by the erosion of said oxide by said inert material;

f) redepositing said eroded oxide onto said sidewall and onto a portion of said exposed conductive layer simultaneously with said step e) thereby covering said portion of said exposed conductive layer with said eroded oxide and narrowing the contact thereby.

10. The process of claim 9 wherein said inert material is argon.

11. The process of claim 9 wherein said inert material is selected from the group consisting of krypton and xenon.

12. The process of claim 9 wherein said faceted edge forms an angle of between about 45° and 50° with said planar oxide layer.

13. The process of claim 9 wherein said facet etch erodes between about 600Å and 800Å of said oxide layer in a horizontal direction, and about 2400Å to about 3200Å of said oxide layer in vertical direction.

14. The process of claim 9 wherein said inert material is argon, said faceted edge forms an angle of between about 45° and 50° with said planar oxide layer, and wherein said facet etch erodes between about 600Å and 800Å of said oxide layer in a horizontal direction, and about 2400Å to about 3200Å of said oxide layer in a vertical direction.

15. The process of claim 14 wherein said etching step comprises an etcher having an RF power setting of between about 300–700 watts, a pressure of between about 10–30 millitorr, and an etchant delivery set at between about 30–70 standard cubic centimeters.

16. A process for forming a sloped contact during the formation of a semiconductor device comprising the following steps:

a) forming a planar oxide layer over an aluminum layer;

b) forming a photoresist layer over said oxide layer thereby covering a portion of said oxide layer and leaving a portion of said oxide layer exposed;

c) etching said exposed portion of said oxide layer thereby forming a sidewall in said oxide layer and an angle at a junction of said covered oxide layer and said sidewall, said oxide removal exposing a portion of said aluminum layer;

d) removing said photoresist layer;

e) facet etching a portion of said oxide layer at said junction with an etchant to form a faceted edge and a redeposited layer, said faceted edge formed by the erosion of said oxide by said etchant and said redeposited layer formed by the redeposition of said eroded oxide onto said sidewall;

f) redepositing said eroded oxide onto said sidewall and onto a portion of said exposed aluminum layer simultaneously with said step e) thereby covering said portion of said exposed conductive layer with said eroded oxide and narrowing the contact thereby;

g) forming a conductive layer over said oxide to contact said aluminum layer.

17. The process of claim 16 wherein said etchant comprises the use of argon.

18. The process of claim 16 wherein said etchant comprises the use of a material selected from the group consisting of krypton and xenon.

19. The process of claim 16 wherein said facet etch erodes between about 600Å and 800Å of said oxide layer in a horizontal direction, and about 2400Å to about 3200Å of said oxide layer in vertical direction.

20. The process of claim 16 wherein said inert material is argon, said faceted edge forms an angle of between about 45° and 50° with said planar oxide layer, and wherein said facet etch erodes between about 600Å and 800Å of said oxide layer in a horizontal direction, and about 2400Å to about 3200A of said oxide layer in a vertical direction.

21. The process of claim 16 wherein said etching step comprises an etcher having an RF power setting of between about 300–700 watts, a pressure of between about 10–30 millitorr, and an etchant delivery set at between about 30–70 standard cubic centimeters.

* * * * *

UNITED STATES PATENT AND TRADEMARK OFFICE
CERTIFICATE OF CORRECTION

PATENT NO. : 5,320,981
DATED : June 14, 1994
INVENTOR(S) : Guy T. Blalock

It is certified that error appears in the above-indentified patent and that said Letters Patent is hereby corrected as shown below:

Column 1, line 50, after "acids" please replace "of" with --or--.

Column 2, line 20, after "photoresist layer" kindly replace "in" with --is--.

Column 2, line 59, after "limiting" please delete the first occurance of "of the".

Column 3, line 16, after "MSC is" please replace "describes" with --described--.

Column 3, line 47, after "over" please replace "said" with --the--.

Column 3, line 48, please replace "said" with --the--.

Column 5, line 6, after "sidewall 20" kindly insert --or--.

Column 6, line 61, please amend "method" to --process--.

Column 7, line 36, after "600" please delete "521" and insert --Å--.

Signed and Sealed this

Thirteenth Day of December, 1994

Attest:

BRUCE LEHMAN

*Attesting Officer*     *Commissioner of Patents and Trademarks*